United States Patent
Choi et al.

(10) Patent No.: US 6,191,460 B1
(45) Date of Patent: Feb. 20, 2001

(54) IDENTICAL GATE CONDUCTIVITY TYPE STATIC RANDOM ACCESS MEMORY CELL

(75) Inventors: Jeong Y. Choi, Palo Alto; Chuen-Der Lien, Los Altos Hills, both of CA (US)

(73) Assignee: Integrated Device Technology, Inc., Santa Clara, CA (US)

(*) Notice: Under 35 U.S.C. 154(b), the term of this patent shall be extended for 0 days.

(21) Appl. No.: 09/390,454

(22) Filed: Sep. 7, 1999

(51) Int. Cl.[7] ................................................. H02L 29/94
(52) U.S. Cl. .................. 257/393; 257/344; 257/369; 257/371; 257/391; 257/392; 438/231; 438/232; 438/279
(58) Field of Search ...................... 257/344, 369, 257/371, 391–3; 438/231, 232, 279

(56) References Cited

U.S. PATENT DOCUMENTS

| | | | |
|---|---|---|---|
| 5,589,701 | * 12/1996 | Baldi | 257/372 |
| 5,780,330 | * 7/1998 | Choi | 438/232 |
| 5,804,477 | 9/1998 | Lien | 438/210 |
| 6,031,267 | * 2/2000 | Lien | 257/344 |

* cited by examiner

Primary Examiner—J. Carroll
(74) Attorney, Agent, or Firm—Skjerven Morrill MacPherson, Franklin & Friel

(57) ABSTRACT

A static random access memory cell is given increased stability and latch-up immunity by using N-type gate NMOS transistors and P-type gate PMOS transistors in the control and sensing circuits, but using the same gate conductivity type for both the NMOS and PMOS memory cell transistors. For example, both NMOS and PMOS memory cell transistors have N-type gates. Weakening the memory cell load transistors by lightly doping the source and/or drain regions further enhances stability.

11 Claims, 6 Drawing Sheets

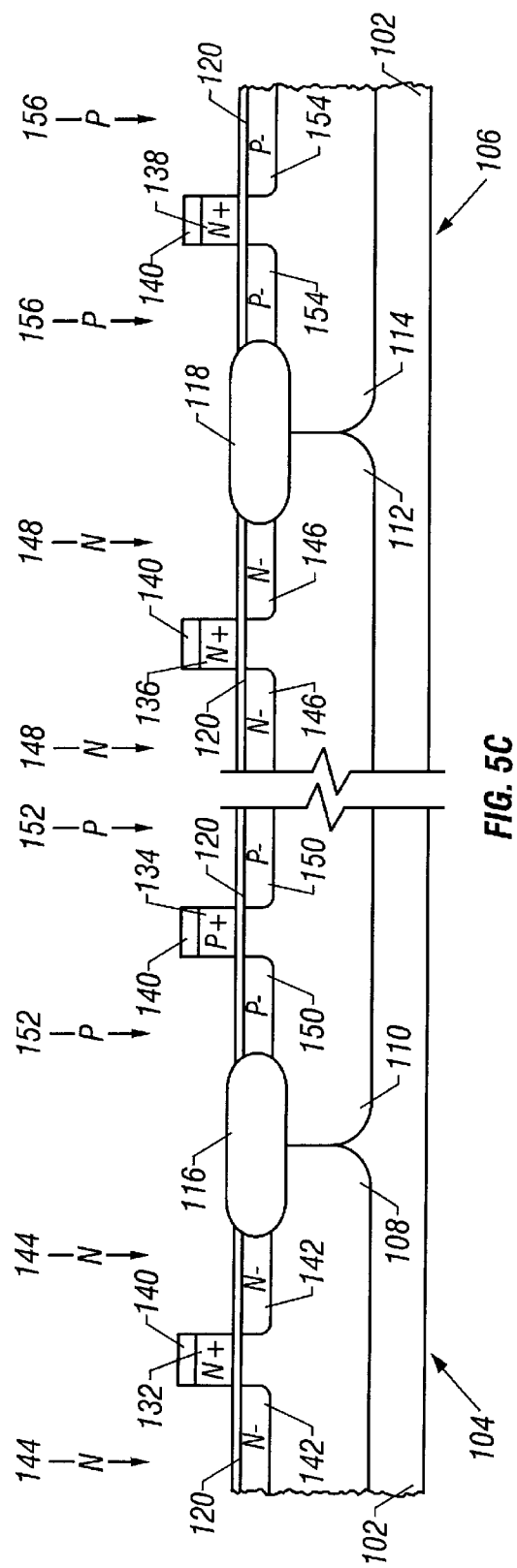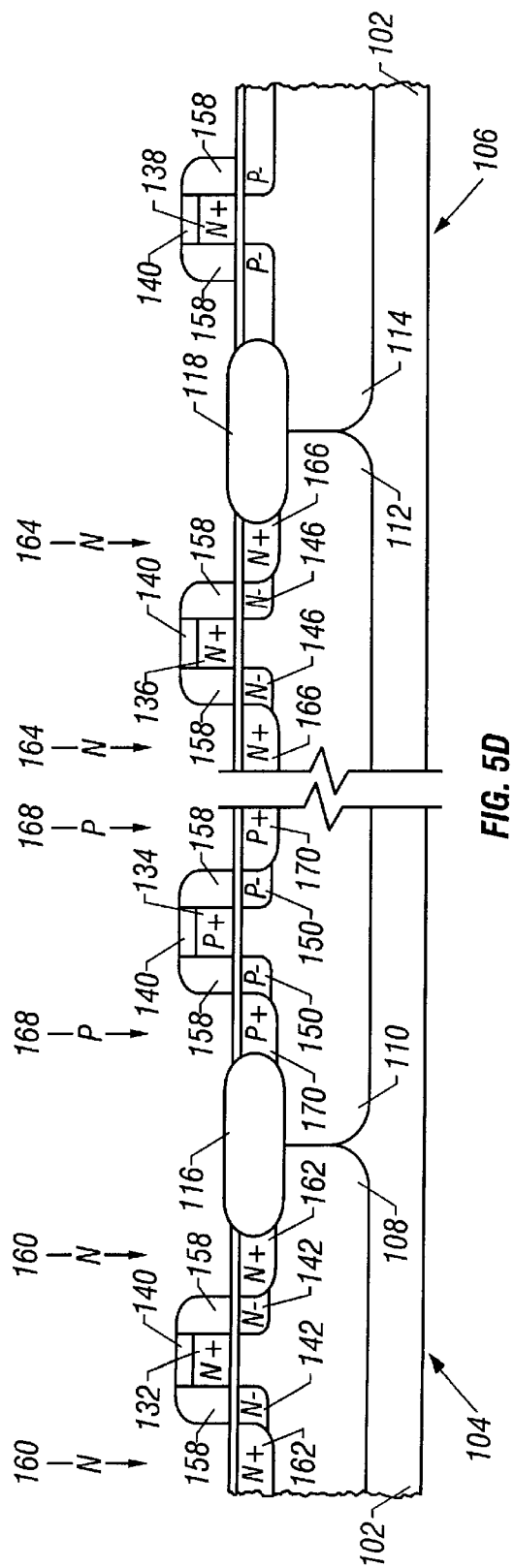

IDENTICAL GATE CONDUCTIVITY TYPE STATIC RANDOM ACCESS MEMORY CELL

BACKGROUND

1. Field of Invention

This invention relates to semiconductor integrated circuit memory devices, and more particularly to static random access memory (SRAM) devices in which some insulated gate transistors have N-type conductivity gates and other insulated gate transistors have P-type conductivity gates.

2. Related Art

Static random access memory (SEAM) cells using cross-connected complementary metal oxide semiconductor (CMOS) inverters are widely used. FIG. 1 is a schematic drawing showing a typical prior art six transistor (6T) SRAM cell 2. As shown, transistors N1, N2, N3, and N4 are N-type MOS (NMOS) transistors and transistors P1 and P2 are P-type MOS (PMOS) transistors.

As shown, transistors P1 and N1 form inverter 10. Transistor P1 is coupled between a voltage source (not shown) supplying voltage $V_{DD}$ (typically 5.0 or 3.5 volts, although other voltages are possible, e.g., 2.5 volts) and node A. Transistor N1 is coupled between node A and a second voltage source (not shown) supplying voltage $V_{SS}$ (typically a reference potential, e.g., ground). Similarly, transistor P2 is coupled between $V_{DD}$ and node B, and transistor N2 is coupled between node B and $V_{SS}$. Inverters 10 and 12 are cross-connected such that node A is coupled to the gates of transistors P2 and N2, and node B is coupled to the gates of transistors P1 and N1. Thus if a logic low state, for example low voltage, exists at node A, transistor P2 conducts and transistor N2 does not conduct. The voltage at node B is therefore approximately $V_{DD}$ and a logic high state, for example high voltage, exists at node B. Due to the logic high state at node B, transistor P1 does not conduct and transistor N1 conducts. The voltage at node A is therefore approximately $V_{SS}$ and a logic low state exists at node A. Accordingly, the cross-connected inverter configuration is stable.

FIG. 1 also shows select transistor N3 coupled between node A and bit line 14, and select transistor N4 coupled between node B and $\overline{bit}$ line 16. The gates of transistors N3 and N4 are each coupled to word line 18. Of importance is that current flows in transistors P1 and P2 as nodes A and B, respectively, change logic state. Over time, and in large memory cell arrays, the cumulative current flows may be a significant factor in overall circuit power consumption.

FIG. 1 includes a conventional sensing circuit 20 and conventional control circuit 22. Sensing circuit 20 is coupled to bit line 14 and $\overline{bit}$ line 16. Control circuit 22 is coupled to bit line 14, $\overline{bit}$ line 16, and word line 18. Persons skilled in the art will understand that circuits 20 and 22 provide voltage sources that control writing and reading of information stored as logic states in SRAM cell 2. Circuits 20 and 22 typically contain both NMOS and PMOS transistors in a variety of conventional configurations.

In early 6T-SRAM integrated circuits the NMOS and PMOS transistors both in the memory cells, and in the control and sensing circuits, were formed with conductive polycrystalline silicon (polysilicon) gate electrodes (gates) heavily doped to N-type conductivity. Later, a "dual gate process" fabrication approach was used in which all NMOS transistors were formed with polysilicon gates having N-type conductivity and all PMOS transistors were formed with polysilicon gates having P-type conductivity. The dual gate process is typically used to form 3.3V and 2.5V technology SRAM integrated circuits. For example, PMOS transistors having P-type gates are typically used for sensing and control circuits, e.g., circuits 20 and 22, in SRAM integrated circuits because their lower threshold voltage ($V_T$), compared with PMOS transistors having N-type gates, and higher drain-source current ($I_{DS}$) increases operating speed.

FIG. 2 is a simplified cross-sectional view showing a typical CMOS structure. (Note that the overlying passivation layers and source/drain/gate electrode contacts are not shown.) The NMOS and PMOS transistors of the type shown are typically used in, for example, memory cell 2, sensing circuit 20, and control circuit 22 (FIG. 1). As shown, a conventional P-Well semiconductor area 30 (of P-type conductivity) and a conventional N-Well semiconductor area 32 (of N-type conductivity) are each formed in crystalline substrate 34. Conventional field oxide layer 36 and conventional gate oxide layer 40 are each formed on substrate 34's surface 38 as shown. Conductive gate 42A is formed on oxide layer 40 above region 30 and conductive gate 42B is formed on oxide layer 40 above region 32. In single gate technology, gates 42A and 42B are typically heavily N-type (N+) doped polysilicon. For dual gate technology, gate 42A is typically N+ polysilicon, and gate 42B is typically heavily P-type (P+) doped polysilicon.

As shown, NMOS transistor 44 is formed with N+ regions 46, and with lightly doped N-type (N−) regions 48 underlying conventional sidewall spacers 50 as shown. The N+ regions 46 are approximately aligned (self-aligned) with spacers 50 as shown. The N− regions 48 are approximately aligned (self-aligned) with gate 42A. Also shown is PMOS transistor 52 formed with P+ regions 53, and with lightly doped P-type (P−) regions 54 underlying spacers 50 as shown. The P+ regions 53 are approximately aligned (self-aligned) with spacers 50 as shown. The P− regions 54 are approximately aligned (self-aligned) with gate 42B as shown. Persons skilled in the art will be familiar with various conventional fabrication methods used to form transistors 44 and 52.

Stability is the ability of a memory cell to retain its programmed state; SRAM cell stability is desirable. In 6T SRAMs, e.g., SRAM cell 2, memory cell stability is enhanced by reducing $I_{DS}$ in the pull-up PMOS load transistors when these transistors conduct. One method of reducing $I_{DS}$ is to make the PMOS transistor "weaker" or less conductive. One way of making the PMOS weaker is to lightly dope source and/or drain regions.

U.S. Pat. No. 5,804,477 ('477 Patent), under common assignment with the present invention and incorporated herein by reference, discloses "a 6-T SRAM cell which occupies less chip area, [and] has improved write speed and improved latch-up immunity." See U.S. Pat. No. 5,804,477, col. 3 line 66. In the '477 patent a MOS transistor is made weaker by omitting heavily doped portions of source/drain regions. As described in detail in the '477 patent, lightly doped source and/or drain regions provide increased resistance with a consequent $I_{DS}$ decrease and enhanced SRAM stability.

The '477 patent further discloses a range of dopant concentration ratios between source/drain regions and the substrate region in which the source/drain regions are formed. For example, referring to FIG. 2, if N-Well 32 has a particular dopant concentration, and if the P− source/drain regions 54 comprised the entire source/drain regions, the P− regions 54 would have a dopant concentration of 1 to 2.5 times the particular dopant concentration of N-Well 32. Such a range of ratios also applies to NMOS transistors formed in P-wells.

Although the '477 patent demonstrates lowered $I_{DS}$ and improved stability over previously known 6T SRAMs, further $I_{DS}$ reductions and enhanced memory cell stability are desirable. Improved stability is especially important in low voltage memory cells, such as those operating at approximately 2.5 volts.

SUMMARY

In accordance with the invention, the dual gate process is modified so that both NMOS and PMOS memory cell transistors have gates of the same conductivity type. As in conventional SRAM integrated circuits, the associated NMOS sensing and control circuit transistors have N-type gates and the associated PMOS sensing and control circuit transistors have P-type gates. However, in one embodiment the NMOS and PMOS memory cell transistors are all formed with N-type gates. Therefore, for this embodiment, the PMOS load transistors in the memory cell have N-type gates. A PMOS transistor with an N-type gate is "weaker" than a PMOS transistor with a P-type gate. The N-type gate PMOS transistor has a higher threshold voltage and a reduced drain-source current than a P-type gate PMOS transistor. Accordingly, memory cell stability and latch-up immunity are enhanced.

Alternatively, the NMOS and PMOS memory cell transistors are all formed with P-type gates. In this alternative embodiment, the NMOS load transistors in the memory cell have P-type gates. An NMOS transistor with a P-type gate is "weaker" than an NMOS transistor with an N-type gate. The P-type gate NMOS transistor has a higher threshold current and a reduced drain current than an N-type gate NMOS transistor. Again, memory cell stability and latch-up immunity are enhanced.

In other embodiments the memory cell transistors with opposite conductivity type gates are further weakened to further enhance stability. In some embodiments, the N-type gate PMOS memory cell transistors are formed with lightly doped source and/or drain regions. In other embodiments, the P-type gate NMOS memory cell transistors are formed with lightly doped source and/or drain regions.

Various conventional fabrication processes may be used to form, e.g., 6T SRAM integrated circuits in accordance with the invention. For example, the PMOS transistor N-type gates may be doped using conventional ion implantation methods, conventional gaseous diffusion methods, or conventional in-situ doping. Actual process step order will vary depending on the fabrication process used.

BRIEF DESCRIPTION OF THE DRAWINGS

FIGS. 5A–5D are cross-sectional views showing various stages of a fabrication process in accordance with the invention.

DETAILED DESCRIPTION

Identically numbered elements in the accompanying drawings identify similar common structures. Those skilled in the art will understand the drawings are representative and not to scale. Furthermore, some conventional elements, such as interconnect wiring, have been omitted from some figures so that the present invention may be more clearly shown. Identically numbered elements among two or more figures represent similar structures.

In accordance with the invention, the dual gate process is modified so that both NMOS and PMOS memory cell transistors have gates of the same conductivity type. As in conventional SRAM integrated circuits, the associated NMOS sensing and control circuit transistors have N-type gates and the associated PMOS sensing and control circuit transistors have P-type gates. However, in one embodiment the NMOS and PMOS memory cell transistors are all formed with N-type gates.

Figure 1:
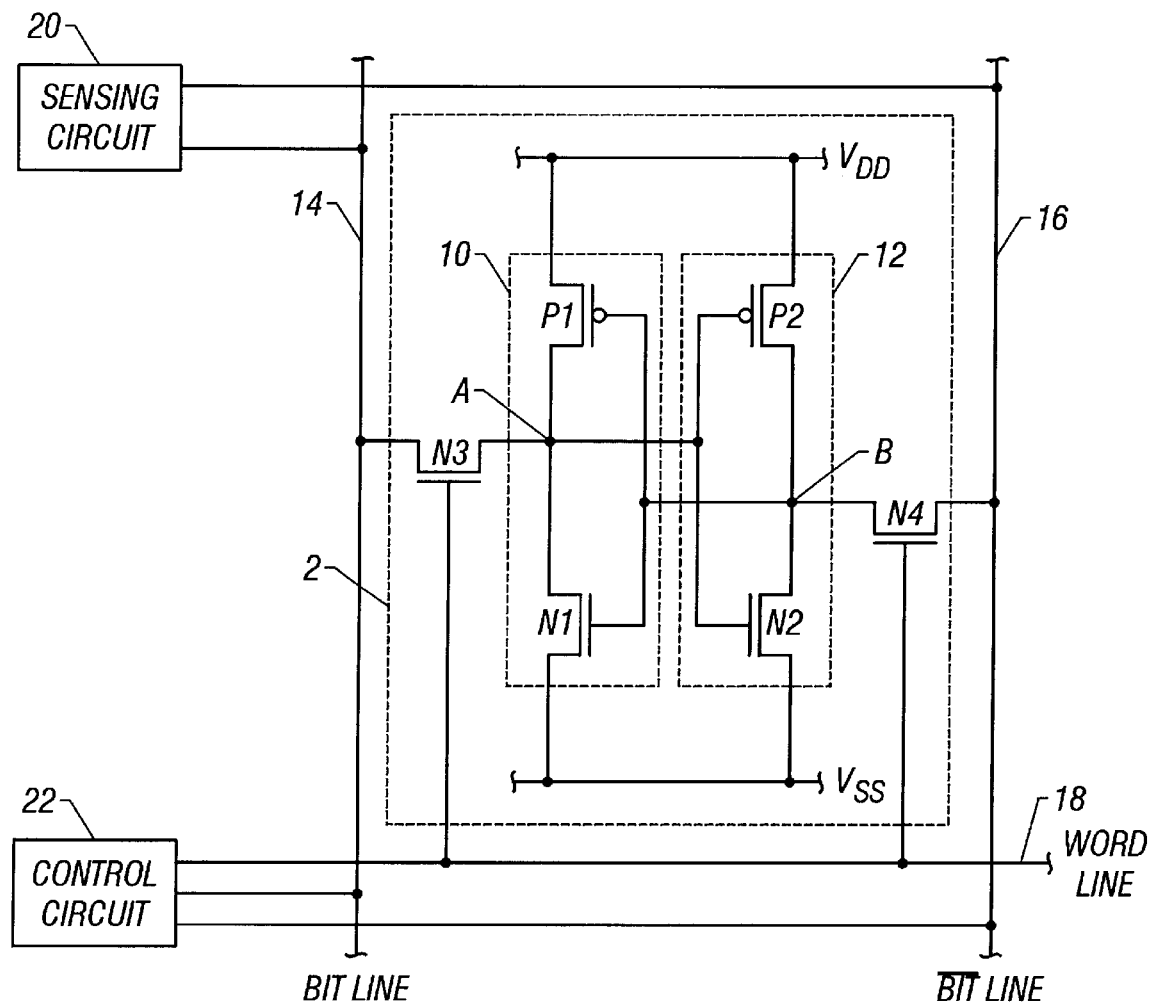
FIG. 1 is a schematic diagram of a prior art six-transistor static random access memory cell coupled with a control and a sensing circuit.
Figure 2:
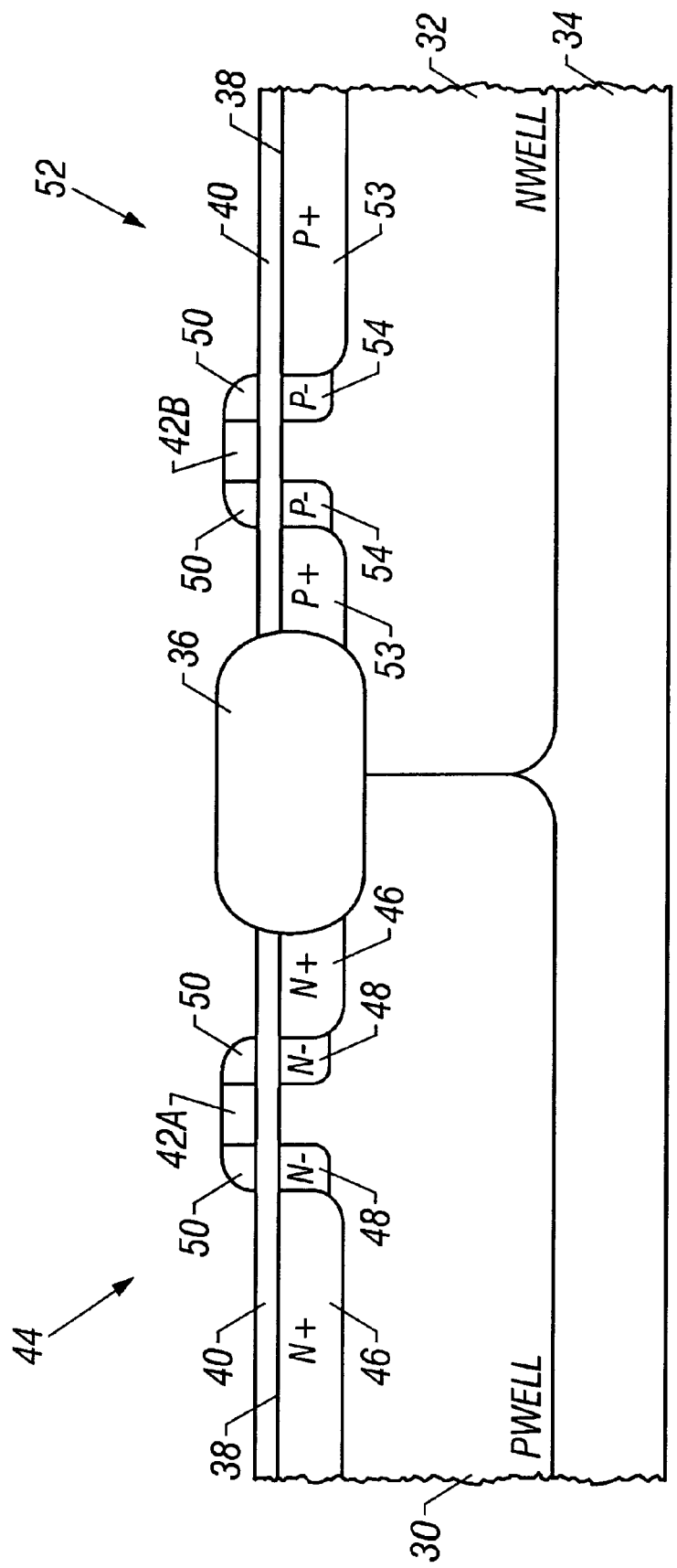
FIG. 2 is a cross-sectional view showing a CMOS structure typically used in SRAM integrated circuit control and sensing circuits.

Therefore, referring to FIG. 1, the transistors of both sensing circuit 20 and control circuit 22 are formed with a conventional dual gate process. Sensing circuit 20 and control circuit 22 have conventional N-type gate NMOS transistors and P-type gate PMOS transistors such as those shown in FIG. 2. In this first embodiment of the invention, however, the load transistors P1 and P2 are N-type gate PMOS transistors and transistors N1, N2, N3, and N4 are N-type gate NMOS transistors. N-type gate PMOS transistors have a higher threshold voltage ($V_T$) than P-type PMOS transistors. The increased $V_T$ reduces the PMOS transistor drain current ($I_{DS}$) when a voltage sufficient to make the transistor conductive is applied to the gate. Accordingly, N-type gate PMOS transistors are considered "weaker" than conventional P-type gate PMOS memory transistors that are typically used in dual gate process SRAM integrated circuits. In some embodiments the N-type gate PMOS transistors are further weakened as described below.

Figure 3:
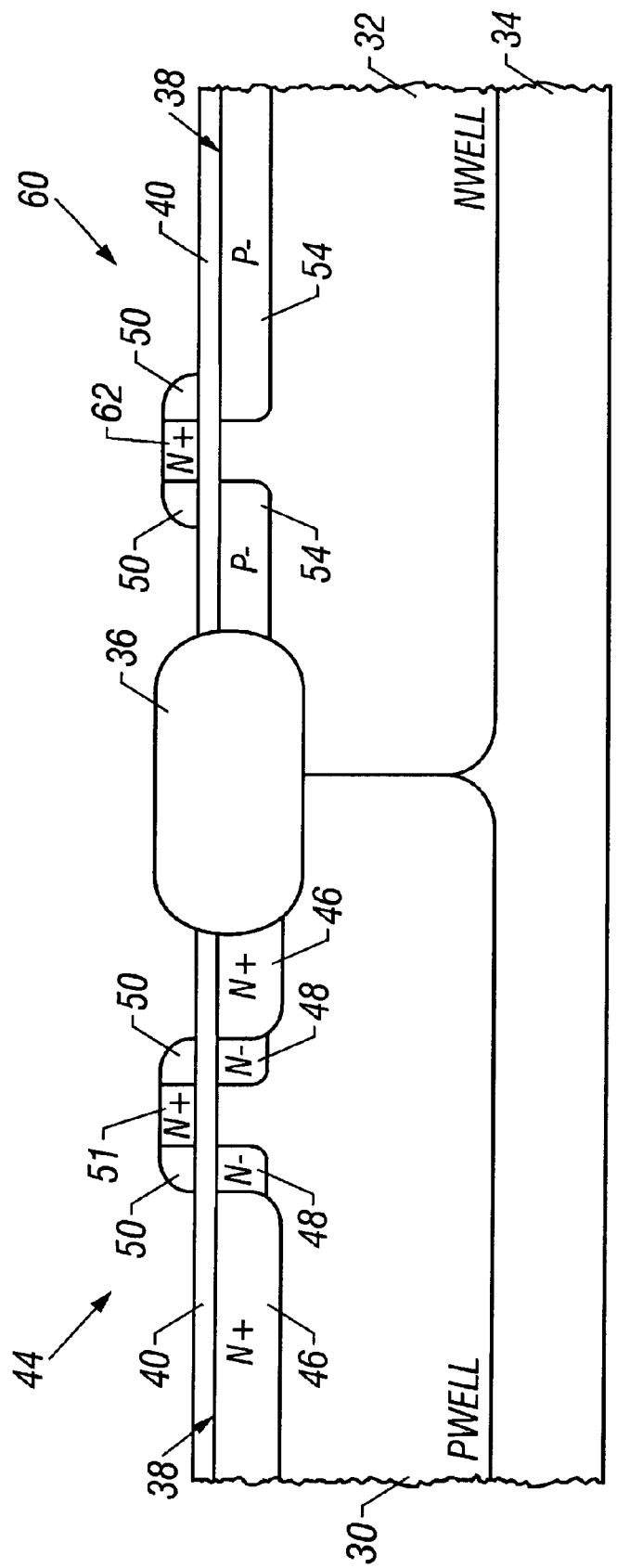
FIG. 3 is a cross-sectional view showing an embodiment of the invention.

FIG. 3 is a simplified cross-sectional view of a CMOS memory cell transistor structure in accordance with the invention. The two transistors shown in FIG. 3 perform the functions of NMOS transistor N1 and PMOS transistor P1 in FIG. 1. As described above in relation to FIG. 2, conventional P-Well 30 and N-Well 32 are formed in substrate 34. Conventional field oxide layer 36 separates P-Well 32 and N-Well 34 at substrate surface 38. Conventional gate oxide layers 40 overlie P-Well 30 and N-Well 32.

In the embodiment shown, NMOS transistor 44 has lightly doped N-type (N−) regions 48 formed in P-Well 30. Regions 48 underlie conventional sidewall spacers 50 and are approximately aligned (self-aligned) with gate 51 as depicted. Heavily doped N-type (N+) regions 46 are formed in P-Well 30 adjacent regions 48 and are approximately aligned (self-aligned) with spacers 50 as shown. Adjacent regions 46 and 48 combine to form a source or drain region for transistor 44. Conductive gate 51 is N+ polysilicon doped to a concentration in the range of approximately $10^{19}$ to $10^{21}$ atoms per cubic centimeter (atoms/cm$^3$) with a target value of approximately $10^{20}$ atoms/cm$^3$.

PMOS transistor 60 has lightly doped P-type (P−) source and drain regions 54 formed in N-Well 32. Regions 54 extend underneath spacers 50 and are approximately aligned (self-aligned) with gate 62 as shown. As described in the '477 patent referenced above, P− source and/or drain regions weaken transistor 60 and accordingly provide increased SRAM memory cell stability. As shown, conductive gate 62 is N+ polysilicon doped to a concentration in the range of approximately $10^{19}$ to $10^{21}$ atoms/cm$^3$ with a target value of approximately $10^{20}$ atoms/cm$^3$. This dopant concentration range further weakens PMOS transistor 60 by increasing the magnitude of $V_T$ by approximately one volt (1V) compared with a PMOS transistor with a P+ gate. In some embodiments the dopant concentrations of gates 51 and 62 are the same. In other embodiments the N-type dopant concentrations of gates 51 and 62 may be different to tailor the performance of the respective transistors.

Referring again to FIG. 1, some embodiments of the invention may substitute PMOS transistors for the cell 2 NMOS transistors as shown, and may substitute NMOS transistors for the cell 2 PMOS transistors as shown. That is, transistors P1 and P2 are NMOS transistors and transistors N1, N2, N3, and N4 are PMOS transistors. In these embodiments NMOS transistors P1 and P2 act as load transistors and the application of potentials $V_{SS}$ and $V_{DD}$ is reversed.

Figure 4:
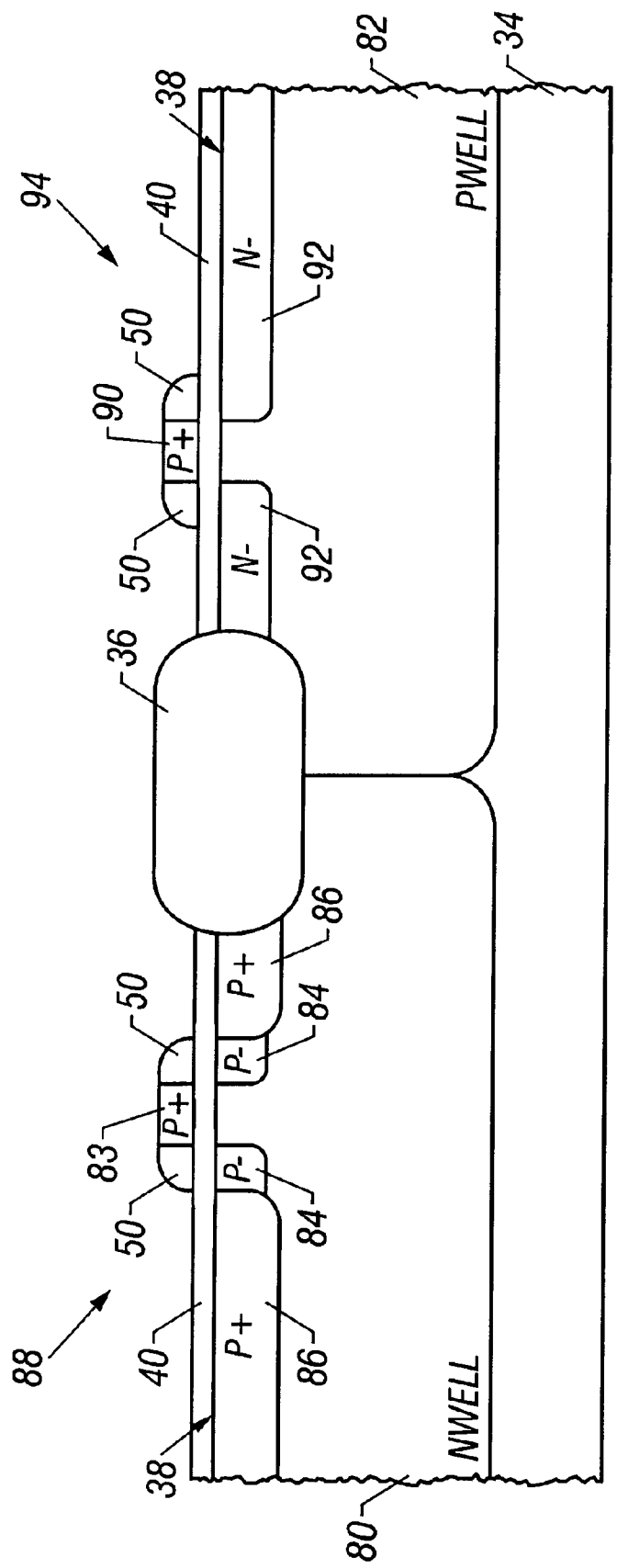
FIG. 4 is a cross-sectional view showing a second embodiment of the invention.

FIG. 4 is a simplified cross-sectional view showing a second embodiment of the invention configured similarly to the FIG. 3 embodiment, except that certain conductivity types are opposite those of FIG. 3. As shown, conventional N-Well 80 and conventional P-Well 82 are formed in substrate 34. N-Well 80 has N-type conductivity and P-Well 82 has P-type conductivity. Conventional field oxide 36 separates N-Well 80 and P-Well 82. Conventional gate oxide layers 40 are formed on surfaces 38 and overlie N-Well 80 and P-Well 82 as shown.

In the embodiment shown, PMOS transistor 88 has lightly doped P-type (P−) regions 84 formed in N-Well 80. Regions 84 underlie conventional sidewall spacers 50 and are approximately aligned (self-aligned) with gate 83 as depicted. P+ regions 86 are formed in N-Well 80 adjacent regions 84 and are approximately aligned (self-aligned) with spacers 50 as shown. Adjacent regions 84 and 86 combine to form a source or drain region for transistor 88. Conductive gate 83 is P+ polysilicon doped to a concentration in the range of approximately $10^{19}$ to $10^{21}$ atoms/cm$^3$ with a target value of approximately $10^{20}$ atoms/cm$^3$.

NMOS transistor 94 has N− source and drain regions 92 formed in P-Well 82. Regions 92 extend underneath spacers 50 and are approximately aligned (self-aligned) with gate 90 as shown. N− source and/or drain regions weaken transistor 94 and accordingly provide increased SRAM memory cell stability. As shown, conductive gate 90 is P+ polysilicon doped to a concentration in the range of approximately $10^{19}$ to $10^{21}$ atoms/cm$^3$ with a target value of approximately $10^{20}$ atoms/cm$^3$. This dopant concentration range further weakens NMOS transistor 94 by increasing the magnitude of $V_T$ by approximately one volt (1V) compared to a NMOS transistor with an N+ gate. In some embodiments the dopant concentrations of gates 83 and 90 are the same. In other embodiments the P-type dopant concentrations of gates 83 and 90 may be different to tailor the performance of the respective transistors.

U.S. Pat. No. 5,804,477 discloses further details of "weak" PMOS or NMOS transistors that may be used in accordance with the present invention. The '477 patent also includes examples of suitable cell layout configurations. The '477 patent also discloses associated bit and word line configurations that have been omitted from this description's drawings so as to more clearly show embodiments of the present invention, but are suitable for use with this invention. Transistor and circuit sizes for embodiments of the present invention may be reduced over those shown in the '477 patent, as described below. Transistors forming a memory cell as described herein are preferably symmetrical but may be asymmetrical.

There are two general approaches to doping gates to either N-type or P-type conductivity. First, gates and source/drain regions may be simultaneously doped. that is, the step of doping the source/drain regions of one transistor simultaneously dopes the gate of another transistor. Simultaneous doping reduces fabrication steps. Source/drain doping, and hence simultaneous gate doping, is typically done using conventional ion implantation methods, although other conventional doping methods exist such as gaseous diffusion.

Another doping approach for the dual gate process is to dope gate and source/drain regions using separate steps. Separate doping allows for separate dopant concentrations in each region or set of regions to be doped. It is therefore possible to optimize dopant concentration in both the gate and the source/drain region. Several fabrication methods require separate doping steps. For example, if a layer of silicide is placed over a polysilicon gate (forming a "polycide" gate) the silicide layer density prevents effective ion implantation doping of the underlying conductive polysilicon. Similarly, if conventional hard masks, such as patterned oxide or nitride layers, are used, the hard mask layer prevents effective doping of underlying materials. Thus separate doping steps are required in these and similar processes.

Both simultaneous and separate doping may be used in embodiments of this invention, although separate doping is preferred because of the increased flexibility it offers in fine-tuning gate dopant concentrations. Actual doping methods, however, are conventional.

FIGS. 5A–5D are simplified cross-sectional views showing one process used to form memory cells in accordance with this invention. Persons skilled in the art will understand that some conventional fabrication steps have been omitted from this description so that the process is more clearly described.

Figure 5A:
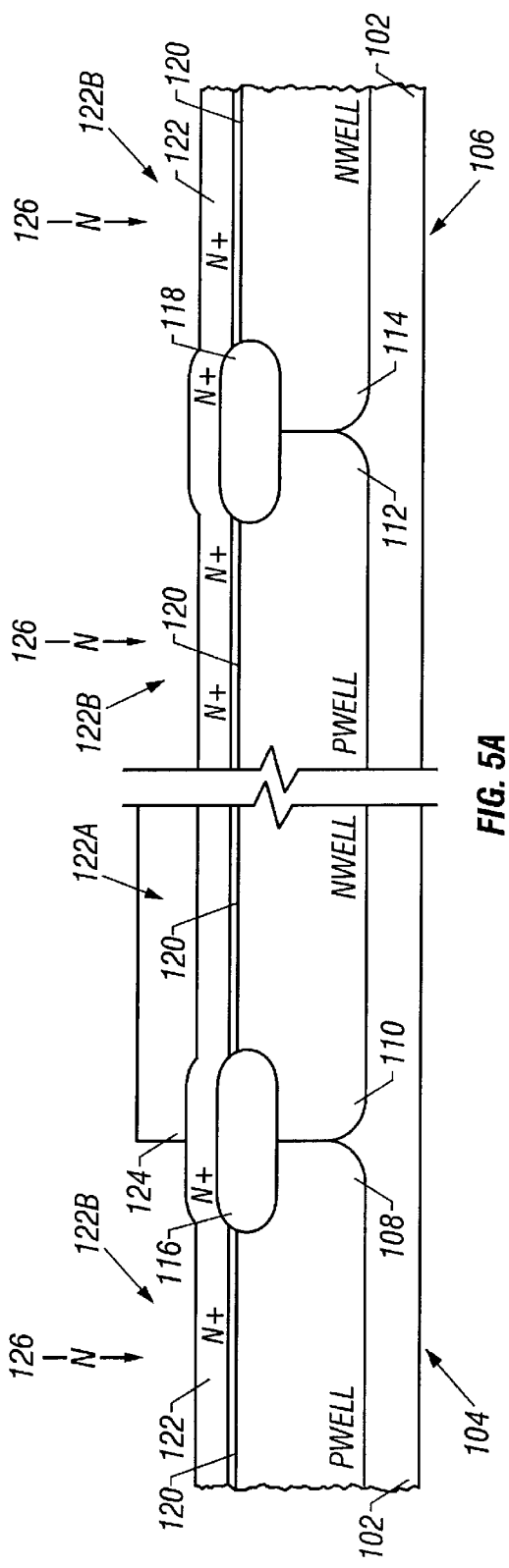

FIG. 5A is a simplified cross-sectional view of an integrated circuit substrate 102 (e.g., silicon wafer). Control circuit CMOS transistors are to be formed in area 104 and memory cell CMOS transistors are to be formed in area 106. As shown, P-Well 108 and N-Well 110 are formed in area 104 of substrate 102 using conventional methods. Similarly, P-Well 112 and N-Well 114 are formed in area 106 of substrate 102. The dopant concentrations of P-Wells 108 and 112 may be identical or may be different, depending on the desired transistor characteristics. The dopant concentrations of N-Wells 110 and 114 may be similarly varied. Conventional field oxide 116 separates P-Well 108 and N-Well 110, and conventional field oxide 118 separates P-Well 112 and N-Well 114.

As shown, gate oxide layers 120 are conventionally formed over the P-Wells and N-Wells in substrate 102. Polysilicon gate layer 122 is then conventionally formed over oxide layers 120. Resist layer 124 is conventionally formed and patterned to expose portions 122B of layer 122 but to prevent the doping of portion 122A of gate layer 122 over P-Well 110. A conventional arsenic ion implantation is then performed, represented by arrows 126, to dope portions 122B to N+ conductivity concentrations as described above. Typical implantation uses 20–80 KeV arsenic ions and a dose of approximately $5*10^{15}$ atoms per square centimeter (atoms/cm$^2$). In one fabrication method a 40 KeV energy level is used.

Figure 5B:
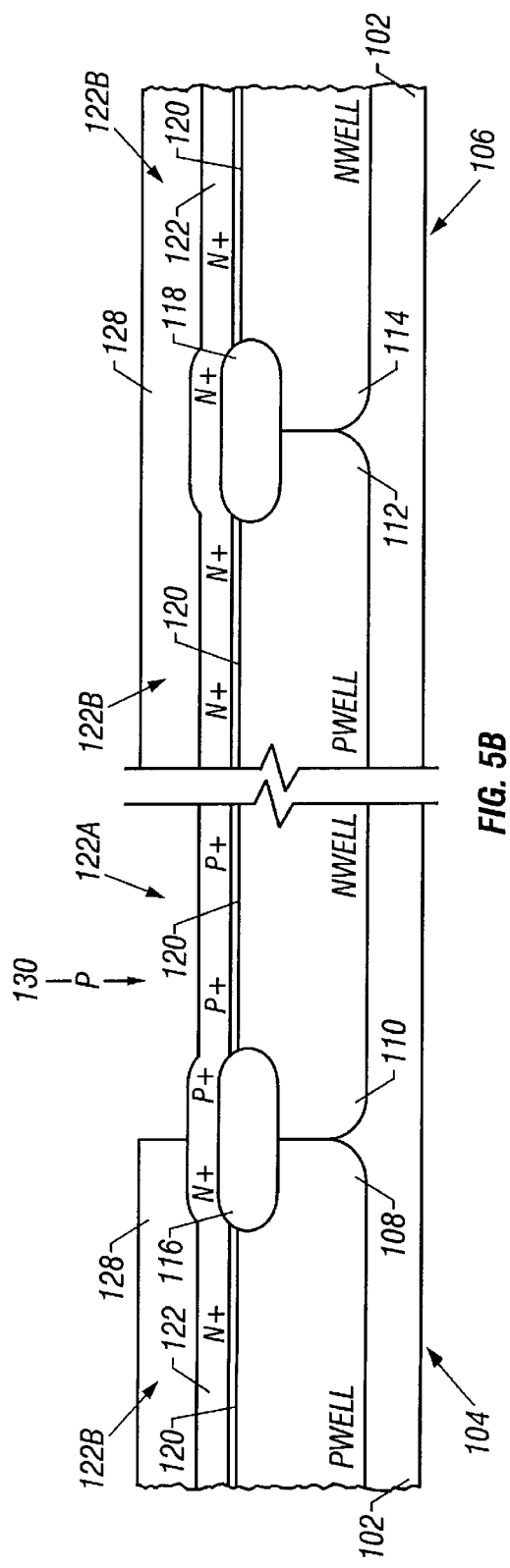

FIG. 5B shows a step in the conventional dual gate process. Resist layer 128 is formed and patterned to expose portion 122A of layer 122. Resist layer 128 remains over P-Well 108 in control circuit area 104, and over P-Well 112 and N-Well 114 in memory area 106 to prevent doping of portions 122B of layer 122. A conventional boron ion implantation is performed, represented by arrow 130, to dope portion 122A to P+ conductivity concentrations as described above. Typical ion implantation uses 5–20 KeV boron ions with a concentration of $5*10^{15}$ atoms/cm$^2$. After doping portions 122A and 122B a single conventional rapid thermal annealing (RTA) is performed. In one embodiment 1000 degrees Celsius for 20 seconds is used to anneal.

Referring to FIG. 5C, following gate layer 122 implantation and annealing, a silicide layer is formed over gate layer 122. The silicide layer and gate layer 122 are then patterned to form conductive gates 132, 134, 136, and 138 as shown. Silicide portions 140 remain over gates 132, 134, 136, and 138 and prevent the gates from being doped during subsequent source/drain doping.

Source/drain regions 142 of N– conductivity are formed in P-Well 108 using conventional ion implantation, represented by arrows 144. Similarly, N– source/drain regions 146 are formed in P-Well 112 using conventional ion implantation, represented by arrows 148. Regions 142 and 146 may be simultaneously formed, or may be separately formed so that regions 142 and 146 have different dopant concentrations. In one embodiment 20 KeV phosphorous ions are implanted with a dose of approximately $5*10^{14}$ atoms/cm$^2$. Source/drain regions 150 of P– conductivity are formed in N-Well 110 using conventional boron ion implantation, represented by arrows 152. Similarly, source/drain regions 154 are formed in N-Well 114 using conventional boron ion implantation, represented by arrows 156. Regions 150 and 154 may be simultaneously formed, or may be separately formed so that regions 150 and 152 have different dopant concentrations. In one embodiment using BF$_2$, 30 KeV boron ions are implanted with a dose of approximately $5*10^{13}$ atoms/cm$^2$.

Referring to FIG. 5D, sidewall spacers 158 are conventionally formed adjacent gates 132, 134, 136, and 138 and the overlying silicide layers 140 as shown. A conventional arsenic ion implantation, represented by arrows 160, forms N+ source/drain regions 162 adjacent the N– regions 142 as shown. Similarly, a conventional arsenic ion implantation, represented by arrows 164, forms N+ source/drain regions 166 adjacent N– regions 146 as shown. Again, the implantations forming regions 162 and 166 may be simultaneous or separate. In one embodiment 60 KeV arsenic ions are implanted with a dose of approximately $2*10^{15}$ atoms/cm$^2$. Another conventional boron ion implantation, represented by arrows 168, forms P+ source/drain regions 170 adjacent P– regions 150 as shown. In one embodiment using BF$_2$, 40 KeV boron ions are implanted with a dose of approximately $2*10^{15}$ atoms/cm$^2$. As shown, the PMOS transistor in memory cell area 106 does not receive another source/drain region ion implantation. In other embodiments, however, the PMOS transistor in memory cell area 106 may receive ion implantation to create at least one P+ source/drain region. Persons skilled in the art will understand that processes similar to those described above may be used when both NMOS and PMOS memory cell transistors have P-type gates.

Other doping methods may be used to form memory cells in accordance with this invention. For example, persons skilled in the art will understand that conventional selective diffusion doping using phosphorous oxychloride (POCl$_3$) may be used to form N-type source/drain regions and conductive gates. Similarly, borane (B$_2$H$_6$) may be used to form P-type source/drain regions and conductive gates. U.S. Pat. No. 5,780,330 under common assignment with the present invention and incorporated herein by reference, contains information regarding selective diffusion technologies. Persons skilled in the art will also understand that memory cells in accordance with this invention may be formed using conventional in-situ doping methods. And persons skilled in the art will further understand that various combinations of conventional ion implantation, diffusion, and in-situ doping may be used to form memory cells in accordance with the present invention.

The higher $V_T$ N-type gate PMOS improves SRAM stability by, for example, improving punch through suppression, reducing standby currents, and increasing latch-up immunity. N-type gate PMOS transistors having a high $V_T$ tend to slow circuits, as is known. In an SRAM cell, however, such as the 6T SRAM shown in FIG. 1, the N-type gate PMOS acts only as a load and so does not significantly effect operating time. A further advantage of using high $V_T$ N-type gate PMOS is that a smaller gate area may be used compared to a P-type gate PMOS. Hence a high $V_T$ N-type gate PMOS device allows enhanced device miniaturization. We have discovered that using this invention allows individual memory cell transistor channels to be reduced ten to twenty percent from the sizes currently used. For example, one dual gate technology 6T SRAM memory cell conventionally formed in 8 $\mu$m$^2$ may now be formed in less than 7 $\mu$m$^2$. Similarly, another dual gate technology 6T SRAM memory cell conventionally formed in 4.5 $\mu$m$^2$ may now be formed in less than 4 $\mu$m$^2$.

A further advantage of this invention is that, for memory cell transistors having N-type gates, it eliminates the possibility of boron penetration into undesired areas of the memory cell. As is known in the art, memory circuits are more sensitive to boron contamination than are control circuits. Accordingly, memory stability is enhanced when both NMOS and PMOS transistors have N-type gates.

While the invention has been described in terms of particular embodiments, those skilled in the art will appreciate that many variations exist. The scope of the invention is therefore limited only by the claims that follow.

We claim:

1. A memory integrated circuit comprising:
   a sensing circuit and a control circuit, wherein the sensing circuit and the control circuit each include PMOS transistors with P-type conductivity gate electrodes and NMOS transistors with N-type conductivity gate electrodes; and
   a memory cell circuit coupled to the control circuit and to the sensing circuit, wherein the memory cell circuit includes PMOS transistors and NMOS transistors coupled together and having gate electrodes of the same selected conductivity type.

2. The integrated circuit of claim 1 wherein the memory cell circuit is a six transistor static random access memory cell, and the selected conductivity type is N-type or P-type conductivity.

3. The integrated circuit of claim 2 wherein the N-type conductivity gate electrodes of the memory cell circuit transistors have a dopant concentration in the range of approximately $10^{19}$ to $10^{21}$ atoms per cubic centimeter.

4. The integrated circuit of claim 2 wherein the P-type conductivity gate electrodes of the memory cell circuit transistors have a dopant concentration in the range of approximately $10^{19}$ to $10^{21}$ atoms per cubic centimeter.

5. The integrated circuit of claim 1 wherein at least one memory cell circuit PMOS transistor has a lightly doped source or drain region.

6. The integrated circuit of claim 1 wherein at least one memory cell circuit NMOS transistor has a lightly doped source or drain region.

7. A process for forming a memory cell, comprising the acts of:

providing a semiconductor substrate;

forming a polycrystalline silicon gate electrode layer over the semiconductor substrate;

selectively doping the gate electrode layer over a first area of the substrate to a first conductivity type;

selectively doping a first portion of the gate electrode layer over a second area of the substrate to the first conductivity type;

selectively doping a second portion of the gate electrode layer over the second area to a second conductivity type opposite the first conductivity type;

patterning the gate electrode layer to define a plurality of first conductivity type conductive gate electrodes over the first area and a plurality of conductive gate electrodes over the second area, wherein the plurality of conductive gate electrodes over the second area includes at least one first conductivity type conductive gate electrode and at least one second conductivity type conductive gate electrode;

selectively doping the substrate adjacent at least one gate electrode over the first area to have the first conductivity type;

selectively doping the substrate adjacent at least one gate electrode over the first area to have the second conductivity type;

selectively doping the substrate adjacent at least one first conductivity type gate electrode over the second area to have the first conductivity type;

selectively doping the substrate adjacent at least one second conductivity type gate electrode over the second area to have the second conductivity type; and coupling the gate electrodes and doped substrate regions in the first area so as to form a memory cell;

whereby the second area is a control/sensing circuit area.

8. The process of claim 7 wherein the first conductivity type is N-type or P-type.

9. The process of claim 7 wherein selectively doping the gate electrode layer over the first area to a first conductivity type comprises doping with a dopant concentration in the range of approximately $10^{19}$ to $10^{21}$ atoms per cubic centimeter.

10. The process of claim 7 wherein selectively doping the substrate adjacent at least one gate electrode over the first area to have the first conductivity type comprises forming a lightly doped source or drain region.

11. The process of claim 7 wherein selectively doping the substrate adjacent at least one gate electrode over the first area to have the second conductivity type comprises forming a lightly doped source or drain region.

* * * * *